(12) United States Patent
Ichikawa

(10) Patent No.: US 7,097,462 B2
(45) Date of Patent: Aug. 29, 2006

(54) PATCH SUBSTRATE FOR EXTERNAL CONNECTION

(75) Inventor: Kinya Ichikawa, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/881,243

(22) Filed: Jun. 29, 2004

(65) Prior Publication Data

US 2005/0287829 A1    Dec. 29, 2005

(51) Int. Cl.
*H01R 12/00* (2006.01)

(52) U.S. Cl. .......................................... 439/66; 439/71

(58) Field of Classification Search .................. 439/66, 439/70–71
See application file for complete search history.

(56) References Cited

U.S. PATENT DOCUMENTS

| 6,095,823 A * | 8/2000 | Banks ........................... 439/66 |
| 6,319,829 B1 * | 11/2001 | Pasco et al. ................. 438/678 |
| 6,586,684 B1 * | 7/2003 | Frutschy et al. ............. 174/260 |
| 6,814,584 B1 * | 11/2004 | Zaderej ......................... 439/66 |
| 6,854,985 B1 * | 2/2005 | Weiss ............................ 439/91 |

* cited by examiner

*Primary Examiner*—Truc Nguyen
(74) *Attorney, Agent, or Firm*—Blakely, Sokoloff, Taylor & Zafman LLP

(57) ABSTRACT

Embodiments include a generally planar patch substrate having external connection pads on one side, electrical connections connected to the external connection pads and extending through the substrate, and plated contacts formed on the electrical connections and extending beyond the other side of the patch substrate. The external connection pads may be connected to one electrical device using solder bumps or balls, and the plated contacts may be connected to contacts of another electrical device by thermo-compression bonding. Also, a surface of the patch substrate having the plated contacts may be attached to the other electrical device using an electrically insulating adhesive. Moreover, the plated contacts may have a smaller surface area than the external connection pads, so that the other electrical device can also have smaller contacts, leaving more space for electrically conductive traces to the contacts on the surface and within layers of the other electrical device.

23 Claims, 5 Drawing Sheets

PATCH SUBSTRATE FOR EXTERNAL CONNECTION

BACKGROUND

1. Field

Electronic device connectors and attachments, and the manufacture and connection thereof.

2. Background

Electronic devices having a field or array of contacts are typically connected to other devices having similar contacts such as a printed circuit board (PCB), "board", or a "motherboard" using molded socket devices, spring clip devices, solder bumps, solder, conductive or nonconductive paste or adhesive, or by other mechanical connector devices or means. One goal of such connector devices or means is generally to provide sufficient physical connection between two devices, such as to resist physical separation of the devices or damage to the devices due to vibration, shock, or thermal factors. Another goal is to cause the fields or arrays of contacts of the devices to individually contact or register with each other, such as to form an electrically conductive connection between the electronics of the devices. In fact, sometimes it is necessary to permanently connect the contacts of a device to another device or board. For example, solder bumps may be used to connect a land grid array (LGA) of a packaging substrate, such as a substrate including a semiconductor active device, processor, or other integrated circuit, to a printed circuit board (PCB), such as a "motherboard" of a computer. The use of solder bump connections typically requires that the packaging substrate and PCB use contacts (or contact pads) having a sufficient surface area, thickness, and spacing therebetween necessary for the solder bumps to form the desired connections between the contacts of the packaging substrate and the contacts of the PBA. Selecting contacts to use may take into consideration the amount of solder and heat necessary to cause the solder bumps to form the desired connections between the contacts of the packaging substrate and the contacts of the PBA. Moreover, selecting contacts to use and wiring or conductive traces to the contacts may take into consideration the amount of solder and heat necessary to cause the solder bumps to form the desired connections between the contacts of the packaging substrate and the contacts of the PBA.

BRIEF DESCRIPTION OF THE DRAWINGS

Various features, aspects and advantages will become more thoroughly apparent from the following detailed description, the set of claims, and accompanying drawings in which:

DETAILED DESCRIPTION

Figure 1:
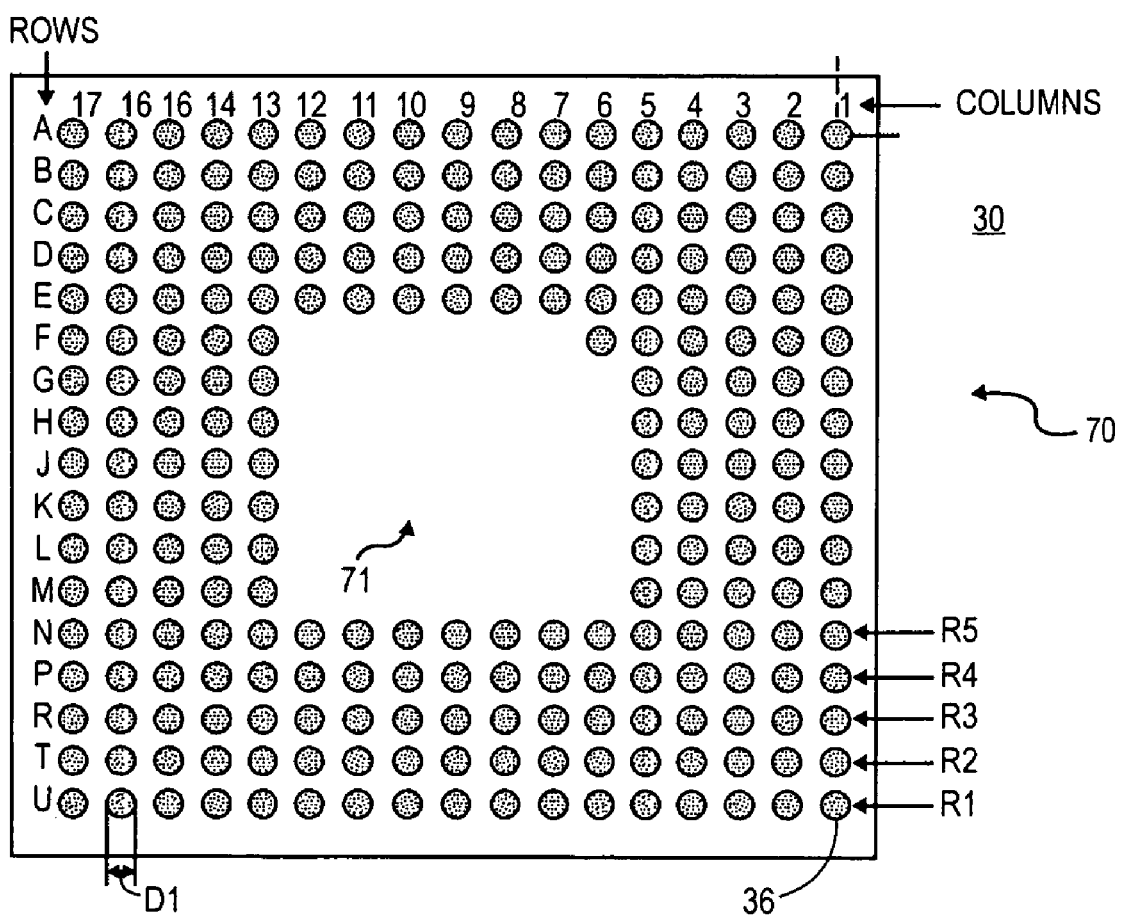
FIG. 1 is a top perspective view of a land grid array (LGA) of contacts.

FIG. 1 is a top perspective view of a land grid array (LGA) of contacts. FIG. 1 shows electronic device 30 having land grid array (LGA) 70 of contacts, with contacts extending along rows A through U, and along columns 1 through 17, excluding center portion 71. It is contemplated that device 30 may be (e.g., such as where LGA 70 is an LGA of) a printed circuit board (PCB), an electronic component "board", a socket, a "motherboard", a video card, a processor, a post processor, a video processor, a memory board, a digital signal processor, a board with a power transformer connection on the board, a board with a device on/off power switch connection on the board. It is also contemplated that device 30 may be (e.g., such as where LGA 70 is an LGA of) a packaging substrate, such as a substrate having (or attached to) an electronic active device, a silicon electronic component, an active silicon device, an integrated circuit, a chip, a memory, a processor, a digital signal processor, a post processor, a video processor, a memory chip, a central processing unit (CPU), etc.

FIG. 1 shows LGA 70 having five rows and five columns of contacts between the outer perimeter and center space 71. Specifically, FIG. 1 shows first row R1, second row R2, third row R3, fourth row R4, and fifth row R5. FIG. 1 shows LGA 70 with a 17×17 array of contacts. It may be appreciated that LGA 70 may represent an array of more or less contacts, in more or fewer rows, and/or in more or fewer columns than shown in FIG. 1. Also, LGA 70 may represent and LGA with a larger or smaller center space than space 71, a different shaped array of contacts, and/or having more or fewer rows and/or columns of contacts between the outer perimeter of the LGA and the center space.

According to embodiments, LGA 70 includes first contact 36 of row one R1, and each contact of LGA 70 may be a contact such as contact 36. Moreover, according to embodiments, each contact of LGA 170 may have a diameter D1 between 200 μm and 400 μm, such as by having a diameter of 240, 260, 280, 290, 300, 310, 320, 340, or 360 μm. Also, contacts of LGA 70 may be a type of contact typically attached or electronically coupled to by a solder ball or bump. Alternatively, contacts of LGA 70 may be contacts having a diameter of between 50 μm and 100 μm, such as a diameter of 55, 60, 65, 70, 75, 80, 85, or 90 μm. Moreover, contacts of LGA 70 may be a type of contact connected, attached, or electronically connected to a plated (or capped) contact with a tin-copper interconnection interface and/or thermo-compression bonding.

Figure 2:
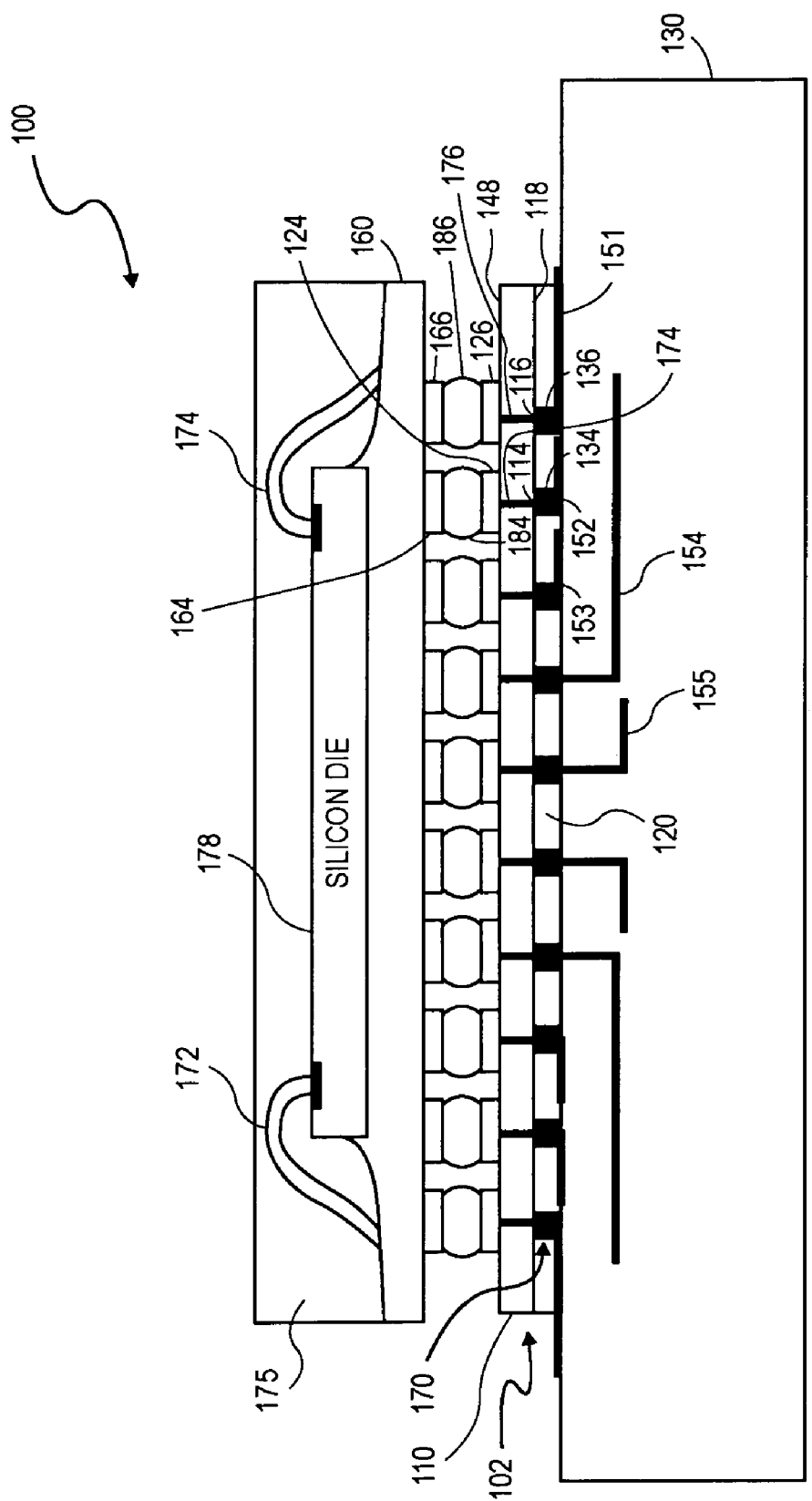
FIG. 2 is a cross-sectional view of a patch substrate having electrical connections running between external connection pads on one side and plated contacts on the other side, and of the patch substrate electrically connecting an LGA of contacts of a first electrical device to an LGA of contacts of a second electrical device.

FIG. 2 is a cross-sectional view of a patch substrate having electrical connections running between external connection pads on one side and plated contacts on the other side, and of the patch substrate electrically connecting an LGA of contacts of a first electrical device to an LGA of contacts of a second electrical device. FIG. 2 shows apparatus 100 including apparatus 102 attaching and electrically connecting contacts of second electrical device 160 (e.g., such as a packaging substrate) to first electrical device 130 (e.g., such as a PCB). Apparatus 102 is shown including patch substrate 110 with first side 118 and second side 148 disposed opposite first side 118. For example, patch substrate 110 may be a core of or layer of an epoxy, a bismaleimide triazine (BT), a polymer, and a polyimide having first side 118 and second side 148 oriented parallel to each other and/or disposed away from each other.

Apparatus 102 also includes a number of external connection pads, such as external connection pad 126 on second side 148 to contact second contact on the surface of second electronic device 160, such as second contact 166. Moreover, apparatus 102 includes a number of electrical connections coupled to the external connection pads extending through patch substrate 110 to first side 118. For example, FIG. 2 shows electrical connection 176 coupled to external connection 126 and extending through patch substrate 110 to first side 118.

Apparatus 102 also includes a number of plated contacts formed on or on the electrical connection and extending beyond (or disposed away from) first side 118. The plated contacts may be aligned to contact a plurality of first contacts of first electronic device 130. For example, FIG. 2 shows plated contact 116 on electrical connection 176 extending beyond first side 118 and aligned to contact first contact 136 of first electronic device 130. Thus, it is contemplated that apparatus 102 and/or patch substrate 110 has a spacing of plated contacts and external connection pads on first side 118 and second side 148, respectively (e.g., a spacing between adjacent plated contacts and a spacing between adjacent external connection pads) to physically align and electronically connect the first contacts of first electronic device with the second contacts of second electronic device 160. It is also contemplated that plated contacts and external connection pads of apparatus 102 and/or patch substrate 110 may have an orientation with respect to each other to physically align and electronically connect the first contacts of first electronic device with the second contacts of second electronic device 160. Specifically, FIG. 2 shows a spacing between plated contact 114 and plated contact 116, and a spacing between external connection pad 124 and external connection pad 126 sufficient such that first contact 134 is electronically coupled to second contact 164 when (or while) first contact 136 is electronically connected or coupled to second contact 166. FIG. 2 also shows plated contact 114 and plated contact 116 oriented appropriately, disposed, and/or physically aligned; and external connection pad 124 and external connection pad 126 oriented appropriately, disposed, and/or physically aligned, such that first contact 134 is electronically coupled to second contact 164 when or while first contact 136 is electronically connected or coupled to second contact 166. According to embodiments, plated contacts such as plated contacts 116 and 114 may also be referred to as exposed metal plates, metal cap, and/or capped contacts herein. Also, electrical connections may be referred to as electrically conductive material columns herein.

It is considered that external connection pads (e.g., such as pad 126) plated contacts (e.g., such as contact 116), contacts of first electronic device 130 (e.g., such as contact 136), and contacts of second electronic device 160 (e.g., such as contact 166) may be contacts as described above for contact 36 of FIG. 1. Moreover, the external contact pads may be formed of an electrically conductive material, such as copper, silver, gold, aluminum, tin, and/or a conductive polymer. In addition, such contacts as conductive materials may include or be coated with an organic solderability preservative (OSP) such as a thin organic coating applied in a vertical or conveyorized chemical process that is not conductive but protects or coats the conductive material. FIG. 2 also shows LGA 170. It is contemplated that LGA 170 may be a land grid array such as is described above with respect to LGA 70 of FIG. 1.

In addition, according to embodiments, the external connection pads of apparatus 102, such as pad 126, may be portions, parts, or "islands" of a layer of conductive material formed over first surface 118, such as a conductive material that has been removed except for the portions, parts, or islands that include the external connection pads. Thus, the external connection pads may have all been part of a single layer of foil (e.g., foil of an electrically conductive material, and/or copper foil) of which the other portions have been removed. In addition, it is to be appreciated that the external connection pads may be portions, parts, or islands of a conductive material (e.g., a surface plating or coating, such as of a metal), that was formed over electrical connections 176 and/or patch substrate 110. Furthermore, the external connection pads of apparatus 102 may form a ball grid array or "land" of connection or contact pads to removably or permanently attach (e.g., such as by being electrically connect to and/or solder to) a plurality of solder balls or bumps. It is to be appreciated that the solder balls or bumps may then be permanently or removably attached, electrically connected, and/or soldered to contacts of another device, such as second contacts of second electronic device 160. For example as shown in FIG. 2, external connection pad 126 may be a ball grid array connection pad to be soldered to solder bump 186 which in turn will be soldered or reflowed to second contact 166.

Furthermore, according to embodiments, external connection pads, such as pad 126, and/or plated contacts, such as contact 116, may have a spacing (e.g., between adjacent pads or contacts), orientation, and/or physical dimension to be attached to contacts of electronic devices by solder, solder bumps or balls, conductive paste, conductive adhesive, thermal bonding, laser bonding, pressure bonding, or other means for forming an electrically conductive connection and/or an attachment.

Next, the electrical connections, such as electrical connection 176, may be a column of electrically conductive material, a via structure filled with electrically conductive material, a through hole filled with electrically conductive material, a wire, an electrical conduit, or other devices or means of conducting electric current and energy. Moreover, according to embodiments, plated contact 116 may be a metal cap formed on electrical connection 176 or may be a surface plating or coating formed on electrical connection 176 of solder, tin, silver, gold, copper, and/or a lead-free solder (e.g., such as to form a lead-free solder cap over electrical connection 176).

FIG. 2 also shows cured non-conductive or electrically insulating adhesive 120 attaching apparatus 102 and/or patch substrate 110 to a surface of first electronic device 130. For example, electrically insulating adhesive 120 may be a material layer or B-stage adhesive that is cured and has a thickness between 5 µm and 50 µm, such as having a thickness of 30 µm permanently or removably attaching patch substrate 110 to first electronic device 130. Moreover, adhesive 120 may be a cured thermally-resistive adhesive, such as an adhesive that once cured is resistant to heat treatment such as a thermal treatment that may be experienced during annealing or other silicon device fabrication processes.

Similarly, the plated contacts of apparatus 102 may be connected to first contact of first electronic device 130 by forming a tin-copper interconnection interface or thermo-compression bond between the plated contacts, such as contact 116 may be connected and/or electrically removably or permanently to the first contacts, such as contact 136.

According to embodiments, either first electronic device 130 and/or second electronic device 160 may be an electronic device, such as a PCB, packaged substrate, or other device as described above with respect to electronic device 30 of FIG. 1. For example, first electronic device 130 may be a PCB and second electronic device 160 may be a packaging substrate, such as shown in FIG. 2. Specifically, FIG. 2 shows second electronic device 160, such as a packaging substrate, electronically coupled to silicon die 178 with wires 172 and 174, where the wires and silicon die are disposed within package area 175.

It is worth pointing out that plated contacts, such as contact 116, may be smaller in surface area, contact surface, or a cross-section oriented parallel to first side 118, than are the surface area, contact size, or same cross-section for external connection pads, such as pad 126. Thus, it is worth pointing out that whether an electronic device such as a packaging substrate or PCB is connected to external connection pads such as pad 126 or is connected to plated contacts such as contact 116 of apparatus 102 may be important because of the smaller surface area of the plated contacts as compared to the surface area of the external connection pads. For example, plated contacts, such as contact 116, may have a surface area or size that is related to a surface area or size of external contact pads, such as pad 126, as shown and described below with respect to FIGS. 9 and 11. Thus, such as shown in FIG. 2, first contacts 136 of first electronic device 130 may be smaller in surface area, contact surface, or cross-section with respect to first side 118 than the surface area, contact surface, or same cross-section of second contact 166 of second electronic device 160.

For example, second electronic device 160 may be a PCB and first electronic device 130 may be a packaging substrate, such as in reverse orientation of that shown in FIG. 2. In such an embodiment, solder bumps 186 could be used to connect apparatus 102 to the PCB and the plated contacts, such as contact 116, would connect apparatus 102 to contacts of the package substrate. In other words, if apparatus 102 is oriented in an orientation upside down to that shown in FIG. 2, second electronic device 160 may have smaller contacts than that shown for second contacts 166 (such as a smaller area to connect to plated contact 116 and first contacts of first electronic device 130 may have a size larger than that of first contact 136, (such as a larger area as necessary to connect to external connection pad 126 using solder ball or bump 186.

Thus, first electronic device 130 and second electronic device 160 may be a PCB, a packaging substrate, or any other electronic component or device as described above with respect to electronic device 36 of FIG. 1. In any case, the electronic device connecting (e.g., electrically connecting) to plated contact 116 may use, be designed with, or have smaller contacts to connect to those plated contacts. Likewise, in any case, it is contemplated that second electronic device 160 may also be attached to apparatus 102 using a non-conductive adhesive, such as adhesive 120. For example, in addition to solder balls or bumps 186, a surface of second electronic device 160 may be physically attached or connected to second surface 148 using an adhesive and process as described herein with respect to adhesive 120 and adhesive 520 (e.g., see FIG. 4).

Moreover, FIG. 2 shows first electronic device 130 having first conductive trace 151, second conductive trace 152, third conductive trace 153, fourth conductive trace 154, and fifth conductive trace 155 providing electronic connection, conduit, or signals to the first contacts, such as to first contact 136. In one example, first through fifth conductive traces 151 through 155 are for providing electronic connection to first contacts, such as first contacts 134 and 136, in a single column, such as any of columns 1–17 as shown in FIG. 1, such as by providing electrical connection for contacts of row R1 through R5 of column 9 as shown in FIG. 1. Also, as shown in FIG. 2, first conductive trace 151, second conductive trace 152, and third conductive trace 153 may be formed on or at the surface or a first layer of first electronic device 130. Meanwhile, fourth conductive trace 154 and fifth conductive 155 may be disposed or formed at or in a layer, such as a first or second layer of first electronic device 130.

Figure 3:
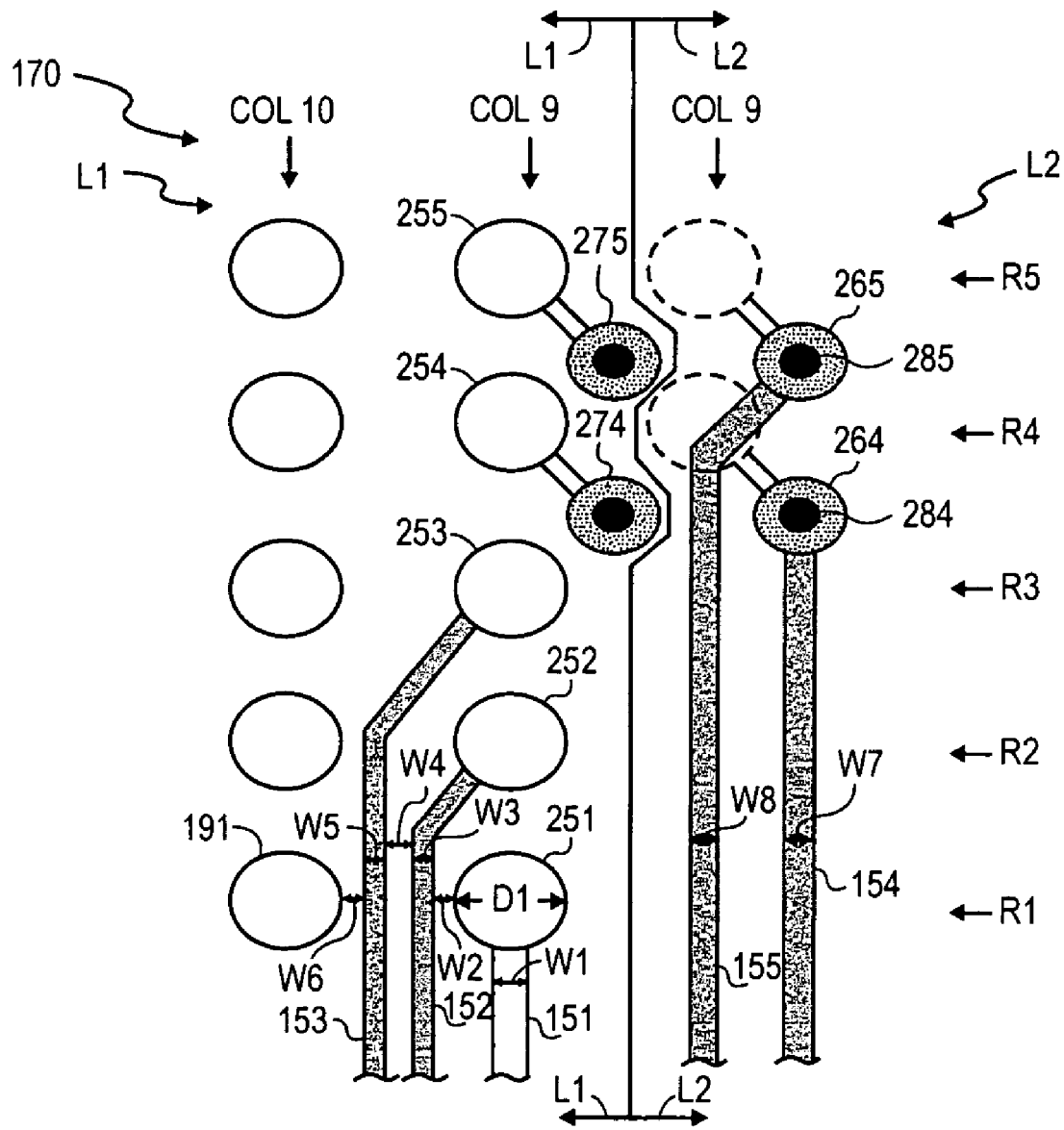
FIG. 3 is a top perspective partial cut away view of electrically conductive traces to electrical contacts of an LGA of an electrical device.

Specifically, FIG. 3 is a top perspective partial cut away view of electrically conductive traces to electrical contacts of an LGA of an electrical device. FIG. 3 shows a cutaway having first layer L1 with columns 9 and 10, rows R1 through R5; and second layer L2 having column 9, rows R1 through R5. It is considered that first layer L1 is a layer disposed, on, overlying, formed on, or otherwise above or between second layer L2 and a surface of an electronic device, such as a surface for contacting apparatus 102 and/or plated contacts thereof, such as plated contact 116.

FIG. 3 shows first through third conductive traces 151 through 153 on or at first layer L1 of first electrical device 130, and fourth through fifth conductive traces 154 through 155 on or at second layer L2 of electronic device 130. First conductive trace 151 is electrically connected to first contact 251, second conductive trace 152 is electrically connected to second contact 252, third conductive trace 153 is electrically connected to third contact 153, fourth conductive trace 154 is electrically connected to fourth contact 254 with via pad 274, via 284, and via pad 264, and fifth conductive trace 155 is electrically connected to fifth contact 255 with via pad 275, via 285, and via pad 265. It is contemplated that the electrical connections between the conductive traces and contacts described herein are sufficient electrical connections to provide electrical power, grounding, and signals as required by an electrical device (e.g., an electrical device, such as is described above with respect to device 30 of FIG. 1).

As shown, conductive traces 151–155 may be, disposed, "run", and/or be electrically connected (e.g., to contacts 251–253, and to pads 264–265) using only two layers and in such a manner that traces similar to traces 151 through 155 have sufficient space to "run" or be disposed adjacent to contacts 251 through 255 and be connected to adjacent contacts of column 9 and column 10 (e.g., such as by running a similar configuration of traces to contacts in row R1 through R5 of column 8 and 10). It is possible to run conductive traces 151 through 155 to contacts 251 through 255 using only two layers of an electrical device because contacts 251 through 255 may have diameter D1 and/or be a contact such as described above with respect to first contact 136 to be attached and/or electrically connected to plated contacts of apparatus 102, such as plated contact 116.

First conductive trace 151 may have width W1 of between 50 μm and 150 μm, such as a width of 100 μm. In addition, although first trace 151 is shown approaching contact 251 in a straight line, it may approach at an angle or other than in a straight line, such as is known in the art. Also shown between the edge of contact 151 and second conductive trace 152 is width W2 between 50 μm and 100 μm, such as a width of 75 μm. Second conductive trace 152 has width W3 between 50 μm and 100 μm, such as a width of 75 μm.

Width W4 between second and third conductive traces 152 and 153 may be between 50 μm and 100 μm, such as by being 75 μm. Width W5 of third conductive trace 153 may be a width of between 50 μm and 100 μm, such as by being 75 μm. Width W6 between third conductive trace 153 and contact 191 adjacent thereto, may be between 50 μm and 100 μm, such as by being 75 μm.

Fourth electrically conductive trace 154 has width W7 between 50 μm and 100 μm, such as by being a width of 100 μm. Fifth electrically conductive trace 155 has width W8 between 50 μm and 100 μm, such as having a width of 75 μm.

Specifically, as shown in FIG. 3, conductive trace 151 is shown directly connected or attached to contact 251 in row 1, column 9 of LGA 170. Second conductive trace 152 is shown directly attached to contact 252 in row 2, column 9 of LGA 170. Third conductive trace 153 is shown directly connected to contact 253 at row 3, column 9 of LGA 170. Fourth conductive trace 154 is attached to or electrically connected to via pad 264 on or at second layer L2. Via pad 264 is connected to via pad 274 on first layer L1 with via 284. In turn, via pad 274 is connected to contact 254 on first layer L1. Similarly, fifth conductive trace 155 is attached to or electronically connected to via pad 265 on or at second layer L2. In turn, via pad 265 is connected to via pad 275 on first layer L1 with via 285. In turn, via pad 275 is connected to contact 255 on first layer L1.

Thus, as shown in FIG. 3, first through fifth conductive traces 151 through 155 are able to provide electrical conductivity to contacts 251 through 255 of column 9, rows R1 through R5, using traces and vias on only two layers (e.g., such as two conductive trace layers or a surface and one conductive trace layer of a PCB). Moreover, such electrical conductivity can be provide by traces 151 through 155 and vias thereto, while allowing similar arrangements of traces and vias to provide for electrical conductivity to contacts of adjacent rows, such as to contacts at columns 8 and 10, rows R1 through R5.

In addition, it is considered for embodiments where plated contacts 116 are to be electronically coupled to contacts of an electronic device, such as a packaging substrate, that even more traces may be formed in, at, or on a surface and first layer of the package substrate. In one instance, first electronic device may be a flexible packaging substrate having 8 rows of contact pads in adjacent columns and traces may be formed or on at the surface of the flexible packaging substrate to more than 3 of the rows (e.g., such as by being formed to 4, 5, 6, 7, or 8 rows of contacts) and traces may be formed to more than 2 rows of contacts in the first layer (e.g., such as by being formed 2, 3, 4, or 5 rows of contacts).

Figure 4:
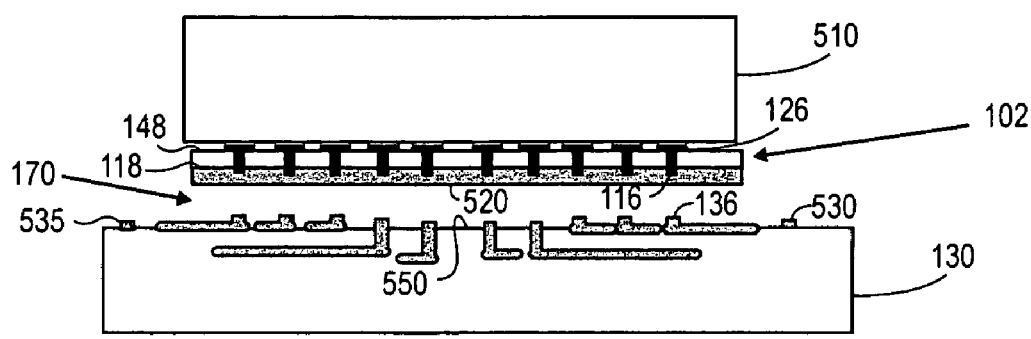
FIG. 4 is a cross-sectional view of a patch substrate attached to a packaging placer for placing the patch substrate on a first electrical device.

FIG. 4 is a cross-sectional view of a patch substrate attached to a packaging placer for placing the patch substrate on a first electrical device. FIG. 4 shows apparatus 102 having wet or uncured electrically insulating adhesive 520 laminated, pasted over, formed over, or otherwise on and/or coating first surface 118. Uncured electrically insulating adhesive 520 may be a wet or uncured adhesive such as adhesive 120 while wet or prior to being cured, or any adhesive as described above with respect to adhesive 120 of FIG. 2 while wet or prior to being cured. It is also contemplated that adhesive 520 may be formed on surface 550 of first electronic device 130 (e.g., such as by spreading the uncured adhesive on a surface), with or without forming a layer of adhesive 520 on first surface 118. FIG. 4 also shows fiducials 530 and 535 and packaging placer 510 demountably coupled of attached to apparatus 102. In one instance, packaging placer 510 may be a placer that uses vacuum detachable coupling to couple to apparatus 102 sufficiently that metal plates of apparatus 102 (such as plated contacts 116) are aligned to contact contacts of first electrical device 130 (such as first contact 136) to within a +/−25 micron tolerance. Also, fiducials 530 and 535 may be PCB fiducials sufficient that metal plates of apparatus 102 such as plated contacts 116 are aligned to contact contacts of first electrical device 130 such as first contact 136 to within a +/−25 micron tolerance.

Figure 5:
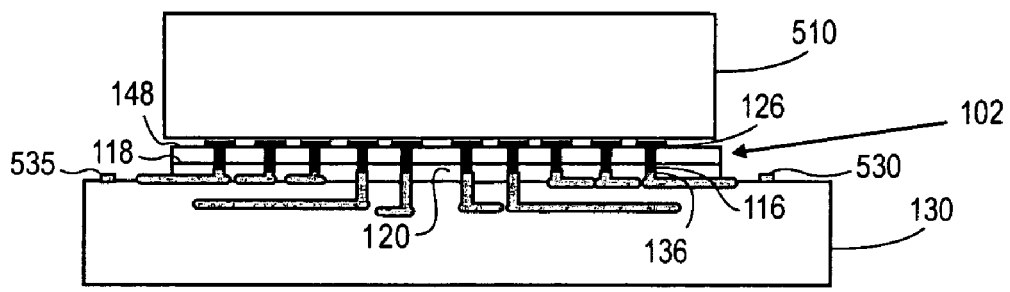
FIG. 5 is a cross-sectional view of a patch substrate being attached to a first electrical device by a packaging placer.

FIG. 5 is a cross-sectional view of a patch substrate being attached to a first electrical device by a packaging placer. FIG. 5 shows apparatus 102 aligned so that metal plates of apparatus 102 such as plated contact 116 are aligned with and to contact first contacts of first electronic device 130 such as contact 136. According to embodiments, vacuum bonding may be used to assure proper connection of apparatus 102 to first electrical device 130, such as to vacuum bond first side 118 and adhesive 520 with surface 550. Furthermore, attaching of apparatus 102 to first electrical device 130 may include curing of electrically insulating adhesive 520. It is also considered that placement or attachment of apparatus 102 with respect to or on to first electrical device 130 may include thermo-compression bonding, or other bonding as described herein with respect to forming an electrical coupling or connection between metal plates of apparatus 102, (such as plated contact 116) and contacts of first electrical device 130 (such as first contact 136).

Figure 6:
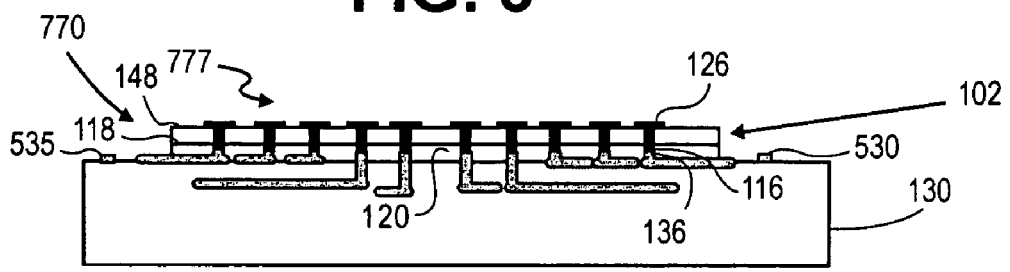
FIG. 6 is a cross-sectional view of a patch substrate attached to a first electrical device and having metal plates electronically coupled to contacts of the first electrical device.

For example, FIG. 6 is a cross-sectional view of a patch substrate attached to a first electrical device and having metal plates electronically coupled to contacts of the first electrical device. Thus, FIG. 6 shows apparatus 102 attached to first electrical device 130 and having metal plates (such as plated contacts 116) electronically connected to contacts of first electronic device 130 (such as electrically connected to contact 136). FIG. 6 also shows external connection pads of apparatus 102 such as external connection pad 126.

As mentioned above, the external connection pads of apparatus 102 and the plated contacts or metal plates of apparatus 102 may form a land grid array of contacts such as those described above with respect to land grid array 70 of FIG. 1. Specifically, as shown in FIG. 6, plated contacts for electrically coupling to first electronic device 130 (such as plated contact 116), may form a land grid array (such as land grid array 770), of contacts having a diameter of between 50 and 100 μm, as described above with respect to land grid array 70 of FIG. 1. Similarly, external connection pads of apparatus 102 (such as external connection pad 126) may form a land grid array (such as land grid array 777) of connection pad having a diameter of between 200 μm and 400 m, as described above with respect to land grid array 70 of FIG. 1.

Figure 7:
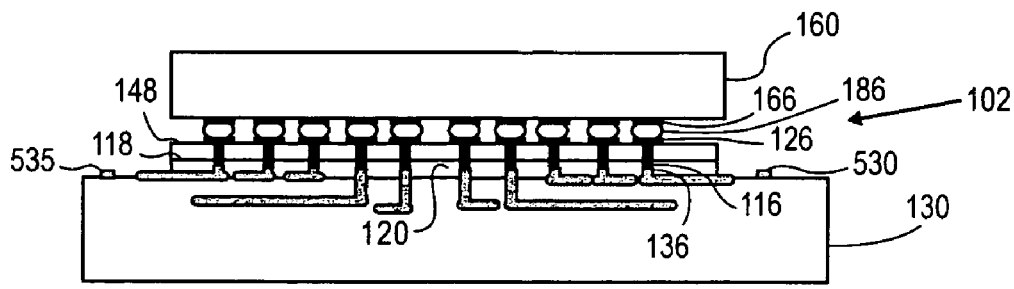
FIG. 7 is a cross-sectional view of a second electrical device attached to and electronically coupled to a patch substrate, and the patch substrate attached to and electronically coupled to a first electronic device.

FIG. 7 is a cross-sectional view of a second electrical device attached to and electronically coupled to a patch substrate, and the patch substrate attached to and electronically coupled to a first electronic device. FIG. 7 shows apparatus 102 and/or patch substrate 110 attached to second electronic device 160 by a plurality of solder balls or bumps. For example, a plurality of solder balls or bumps, such as solder ball 186, may be formed on the external connection pads of apparatus 102, such as external connection pad 126. It is also to be appreciated that the solder balls may be formed on contact pads of second electronic device 160, such as second contact 166.

Then, apparatus 102 and/or patch substrate 110 may be aligned with second electronic device 160 so that the external connection pads of apparatus 102, such as external connection pad 126, are aligned to contact the contacts of second electronic device 160, such as second contact 166. Although FIGS. 4–7 show fiducials 530 and 535, and packaging placer 510 for aligning apparatus 102 and/or second electrical device 160 with respect to first electrical device 130, it is to be appreciated that various other indexing means or alignment processes or devices may be used to provide a proper alignment of apparatus 102, first electronic device 130, second electronic device 160, and/or contacts, metal plates, external connection pads, and plated contacts thereof.

Next, a reflow process, such as a thermo-process, may be used to reflow interconnect the solder ball or bump to the contacts of second electronic device 160, such as second contact 166, and/or to the external connection pads of apparatus 102, such as external connection pad 126. Moreover, the attachment and electrical connection between components of first electronic device 130, second electronic device 160, and apparatus 102 may be similar to those described above for similar components or features as described and shown with respect to FIG. 2. According to embodiments, features of FIG. 7 may or may not correspond with similar features as shown and described above with respect to FIG. 2.

Figure 8:
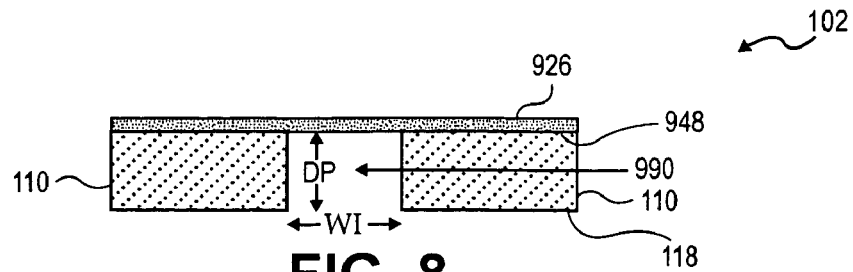
FIG. 8 is a cross-sectional view of a patch substrate having a core material, a layer of foil on the core material, and a hole in the core material.

FIG. 8 is a cross-sectional view of a patch substrate having a core material, a layer of foil on the core material, and a hole in the core material. FIG. 8 shows apparatus 902 such as an apparatus that may be used during the formation of or to form apparatus 102. FIG. 8 shows apparatus 102 having layer of foil 926, such as a layer of conductive foil, formed or disposed over second surface 948 of a core material or substrate, such as patch substrate 110. According to embodiments, layer of foil 926 may be formed by electroplating surface 948 with a conductive material, such as a metal, tin, copper, a single layer of conductive material, and/or copper foil. Patch substrate 110 is also shown with first surface 118 and hole 990 having depth DP and width WI formed through patch substrate 110. For example, hole 990 may be hole or via hole formed or drilled with a laser, $CO_2$ laser, ultraviolet (UV) laser, etching, etc. According to embodiments, first surface 948 may be oriented or disposed similarly to the orientation of surface 148 with respect to surface 118, as described above for FIG. 2.

Figure 9:
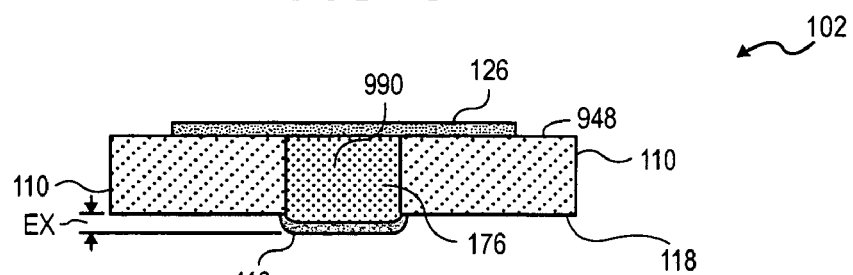
FIG. 9 is the patch substrate of FIG. 8 with a capped electronically conductive material in the hole and portions of the foil removed.

FIG. 9 is the patch substrate of FIG. 8 with a capped electronically conductive material in the hole and portions of the foil removed. FIG. 9 shows apparatus 102 having patch substrate 110, and external connection pad 126. Specifically, apparatus 102 may be apparatus 902 after further manufacturing or process. FIG. 9 shows an electrically conductive material column, such as electrical connection 176 formed in hole 990 and extending to or beyond first surface 118. FIG. 9 also shows an exposed metal plate, such as plated contact 116 formed over electrical connection 176. The exposed metal plate, or plated contact 116, extends beyond surface 118 by distance EX. According to embodiments, EX may be a distance of between 1 μm and 50 μm (e.g., such as by being a distance of between 5 μm and 10 μm) beyond first side 118 (e.g., such as by being a distance of 2, 3, 4, 5, 6, 7, 8, 9, 10 or 15 μm beyond first side 118).

Figure 10:
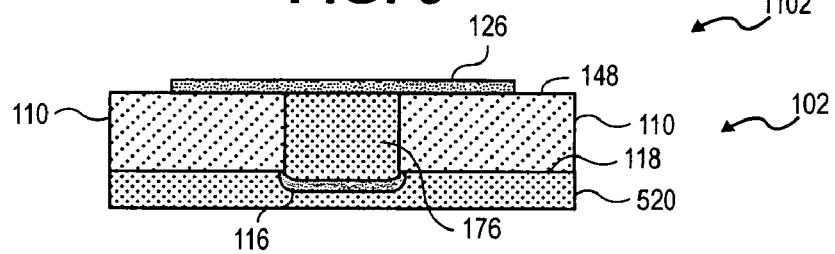
FIG. 10 is the patch substrate of FIG. 9 laminated with an electronically insulating adhesive.

FIG. 10 also shows external connection pad 126 formed on first surface 148, such as by removing a portion of layer of foil 926 to form external connection pad 126. External connection pad 126 has a surface area, contact area, or cross-section with respect to surface 118 that is larger than that of plated contact 116. For example, plated contacts, such as contact 116, may have a surface area or size that is related to a surface area or size of external contact pads, such as pad 126, as shown and described herein with respect to FIGS. 2 and 11. External connection pad 126 is also electrically coupled to or connected to plated contact 116 by electrical connection 176, such as is described above with respect to FIG. 2. Moreover, it is contemplated that electrical connection 176 may directly contact, or be directly attached to external connection pad 126, and/or plated contact 116, so long as a sufficient electrical connection or electrical energy conduit is formed between external connection pad 126 and plated contact 116 to provide signaling, voltage, and/or power as required by first electrical device 130 and second electrical device 160, as described herein. Also, it is contemplated that material may be disposed between electrical connection 176 and external connection pad 126, and/or between electrical connection 176 and plated contact 116, so long as a sufficient electrical connection or electrical energy conduit is formed between external connection pad 126 and plated contact 116 to provide signaling, voltage, and/or power as required by first electrical device 130 and second electrical device 160, as described herein.

Next, it is contemplated that external connection pad 126 or a number of pads for a number of structures similar to that shown in FIG. 9 formed on or in patch substrate 110 may be formed by removing a portion or portions of layer of foil 926. Such removal may be using an etch process, a patterned and etch process, a screen printed conductor process, patterning subtraction, etc. to remove a portion of layer of foil such as to let remain portions, parts, or islands of layer of foil 926, such as described above with respect to forming external connection pad 126 with respect to FIG. 2. Moreover, patch substrate 110 may be a substrate including a sufficient number of structures such as those shown in FIG. 9 so that the patch substrate may be diced into a number of patch substrate portions, each portion having a selected or desired number of the structures shown in FIG. 9. For instance, patch substrate 110 may be a type of wafer or substrate on which devices are typically formed in an integrated circuit (IC) or silicon device processing chamber. After structures, such as those shown in FIG. 9, are formed on such a wafer or substrate, the wafer of substrate may be subsequently diced into portions appropriate for interfacing between electronic devices such as electronic device 30 as described above with respect to FIG. 1.

Referring to FIGS. 8 and 9, hole 990 may be a via hole, through hole, or other orifice drilled through first surface 118 and extending through patch substrate 110 to, or in to layer of foil 926. For instance, hole 990 may extend completely through layer of foil 926 so long as electrical connection 176 provides sufficient electrical connection to external connection pad 126, which may include extending or being disposed within the hole drilled through electrical connection pad 126 or extending beyond that hole. According to embodiments, plated contact 116 may be a metal cap, plating, or coating formed over electrical connection 176, such as described above with respect to FIG. 2.

FIG. 10 is the patch substrate of FIG. 9 laminated with an electronically insulating adhesive. FIG. 10 shows apparatus 1102 having apparatus 102 and uncured electrically insulating adhesive 520 attached to first surface 118. Features shown in FIG. 10 may or may not correspond to similar features shown and described in the description above with respect to FIG. 5.

Figure 11:
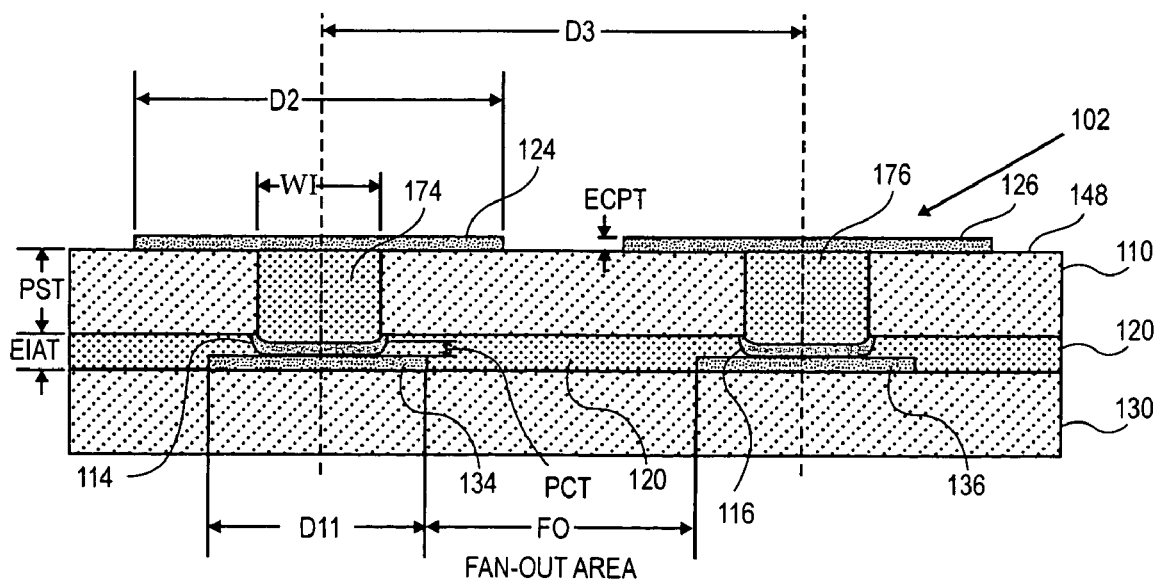
FIG. 11 is the patch substrate of FIG. 10 attached to a first electronic device with the cured adhesive and having metal plates thermo-compression bonded to contacts of the first electronic device.

FIG. 11 is the patch substrate of FIG. 10 attached to a first electronic device with the cured adhesive and having metal plates thermo-compression bonded to contacts of the first electronic device. FIG. 11 shows apparatus 102 attached to first electrical device 130 with cured adhesive 120, and having plated contacts 114 and 116 electrically connected to first contacts 134 and 136. FIG. 12 may represent a portion of FIG. 2 and/or FIG. 6 and correspond to the description thereof.

According to embodiments, and as shown in FIG. 11, patch substrate 110 may have thickness PST of between 25 µm and 200 µm in distance from first surface 118 to second surface 148 (e.g., such as a thickness of 50, 75, 80, 90, 100, 110, 120, 125 or 150 µm). Similarly, plated contact 116 may have thickness PCT between 0.1 µm and 10 µm (e.g., such as a thickness of 0.5, 0.75, 0.8, 0.9, 1.0, 1.1, 1.2, 1.25 or 1.5 µm), and external connection pad 126 may have thickness ECPT between 3 µm and 20 µm and/or a thickness as knows in the art for solder bump or ball contacts. Moreover, as shown in FIG. 11, cured electrically insulating adhesive 120, such as a cured B-stage adhesive, may have thickness EIAT between 5 µm and 50 µm, such as by having a thickness of 20, 25, 30, 35, or 40 µm. Furthermore, plated contacts, such as contacts 114 and 116, may have a diameter or width such as width WI of between 50 µm and 100 µm, such as by having a diameter of 55, 60, 65, 70, 75, 80, 85, or 90 µm. Also, external connection pads, such as pads 124 and 126, may have a diameter, such as diameter D2 between 200 µm and 400 µm, such as by having a diameter of 240, 260, 280, 290, 300, 310, 320, 340, or 360 µm and/or a diameter for such pads as known in the art. Next, electrical connections, such as connections 174 and 176, may have a diameter or width such as width WI of between 50 µm and 100 µm, such as a diameter of 55, 60, 65, 70, 75, 80, 85, or 90 µm (e.g., such as be being a column of electrically conductive material having a diameter of 75 µm).

As shown in FIG. 11, plated contacts 114 and 116 have a smaller contact surface area or diameter than that of external connection pads 124 and 126. Moreover, it is contemplated that the surface area, contact surface, or radius of the plated contacts with respects to the external connection pads may vary in ratio. For example, the plated contacts, such as contact 116, may be 10%, 25%, 30%, 40%, 45%, 50%, 55%, 60%, 75%, or 90% as large as the size of the external connection pads, such as pad 126. Also, plated contacts 134 and 136 may have a contact surface area or size as related to the external connection pads as described above with respect to FIGS. 2 and 9. According to embodiments, plating, plated contact, external connection pad, electrical connections, and/or forming processes thereof may have physical dimension tolerances of +/−5 µm in thickness, depth, width, length, and/or radius.

Since plated contacts 114 and 116 have a smaller contact surface area or diameter than external connection pads 124 and 126, it may be appreciated that plated contacts 114 and 116 attach to, such as contacts 134 and 136, may be smaller than the contacts to which pads 124 and 126 attach. For example, FIG. 11 also shows contacts 134 and 136 of first electrical device 130 having diameter D11, such as a diameter as described above with respect to diameter D1 of FIG. 1. For example, diameter D11 may be a diameter between 75 µm and 200 µm, such as by being a diameter of 90, 100, 110, 115, 120, 125, 130, 135, 140, 150, or 160 µm. Next, FIG. 11 shows fan-out area FO between contacts 134 and 136 of first electrical device 130. For example, FO may be a distance in a range of between 250 µm and 450 µm, such as by being a distance of 300, 330, 350, 360, 365, 370, 375, 380, 385, 390, 400, 410, or 440 µm.

It is to be appreciated that since plated contacts 134 and 136 may be smaller in surface area or diameter than contacts to which external connection pads 124 and 126 attach, that there is more space in fan-out area FO of first electrical device 130, than there will be for a second electrical device attached to external connection pads 124 and 126. For example, see first contacts of first electronic device 130, and conductive traces 151 through 155, as compared to contacts, such as contact 166, and traces thereto, for second electrical device 160, as shown and described above for FIGS. 2 and 3. Thus, first electronic device 130 may have a larger fan-out area for disposing, running, or forming of electrically conductive traces (e.g., such as traces 151–155) to contacts (e.g., such as a row of contacts or a column of contacts disposed parallel or along a line with respect to contacts 134 and/or contact 136), as compared to a second electronic device attached to external connection pads 124 and 126, such as is shown and described above with respect to FIGS. 2 and 3.

Finally, it is to be appreciated that the length, physical dimension, width and overall size of apparatus 102 and/or patch substrate 110 may be smaller than, equal to, or larger than the size or land grid array size of an electronic device (e.g., such as device 30, first electronic device 130 and/or second electronic device 160), so long as apparatus 102 and/or patch substrate 110 provide a sufficient physical dimension or width and length to provide electrical connection with external connection pads and plated contacts between two devices as described herein. In addition, the length, physical dimension, width and overall size of adhesive 520 and/or 120 may be sufficient to physically connect or attach apparatus 120 and/or patch substrate 110 to an electronic device (e.g., such as device 30), described herein.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. An apparatus comprising:
a generally planar patch substrate having a first side and a second side disposed opposite the first side;
a plurality of external connection pads on the second side of the patch substrate to contact a plurality of second contacts of a second electronic device;
a plurality of electrical connections comprising through holes filled with electrically conductive material coupled to the external connection pads and extending through the patch substrate to the first side; and a plurality of plated contacts on the electrical connections and extending beyond the first side and aligned to contact a plurality of first contacts of a first electronic device, wherein a contact surface area of the plated contacts is smaller than a contact surface area of the external connection pads.

2. The apparatus of claim 1, wherein the patch substrate comprises a layer of one of an epoxy, a bismaleimide triazine (BT), a polymer, and a polyimide.

3. The apparatus of claim 1, wherein the patch substrate has a spacing between the plated contacts and adjacent plated contacts; and has a spacing between the external connection pads and adjacent external connection pad to physically align and electronically connect the first contacts with the second contacts.

4. The apparatus of claim 1, wherein the plated contacts comprise a plurality of metal caps formed on the electrical connections.

5. The apparatus of claim 1, wherein each plated contact includes a surface plated or coated with one of a solder and a tin.

6. The apparatus of claim 1, wherein the external connection pads and the plated contacts are formed of an electrically conductive material.

7. The apparatus of claim 1, wherein the external connection pads comprises islands of a layer of electrically conductive material formed over the first surface.

8. The apparatus of claim 1, wherein the external connection pads include an electrically conductive material surface plating or coating of a metal over the electrical connections.

9. The apparatus of claim 1, wherein the external connection pads comprise a plurality of ball grid array connection pads to one of removably attach, electrically connect, and solder to a plurality of solder balls or bumps.

10. The apparatus of claim 1, wherein the external connection pads are a plurality of electrically conductive material contacts to attach to a plurality of solder balls or bumps.

11. The apparatus of claim 1, wherein the patch substrate has a thickness of between 25 micro meters ($\mu$m) and 200 $\mu$m, the plated contacts have a thickness of between 1 $\mu$m and 20 $\mu$m, the external connection pads have a thickness of between 3 $\mu$m and 20 $\mu$m, and the plated contacts extend a distance beyond the first surface of between 5 $\mu$m and 10 $\mu$m.

12. The apparatus of claim 1, wherein the plated contacts have a radius of between 50 $\mu$m and 100 $\mu$m the external connection pads have a radius of between 200 $\mu$m and 400 $\mu$m, and the electrical connections are columns of electrically conductive material having a diameter of between 50 $\mu$m and 100 $\mu$m.

13. The apparatus of claim 1, wherein the electrically conductive material is one of a solder metalization, copper (Cu), silver, tin, aluminum, gold, and an organic solderability preservative (OSP).

14. The apparatus of claim 3, wherein the spacing is sufficient to electronically connect a plurality of contact pads of a land grid array (LGA) to a plurality of contact pads of a printed circuit board (PCB).

15. An apparatus comprising:

a generally planar patch substrate having a first side and a second side disposed opposite the first side;

a plurality of external connection pads on the second side of the patch substrate to contact a plurality of second contacts of a second electronic device;

a plurality of electrical connections comprising a plurality of via structures filled with electrically conductive material coupled to the external connection pads and extending through the patch substrate to the first side; and a plurality of plated contacts on the electrical connections and extending beyond the first side and aligned to contact a plurality of first contacts of a first electronic device, wherein a contact surface area of the plated contacts is smaller than a contact surface area of the external connection pads.

16. The apparatus of claim 15, wherein the electrically conductive material is one of a solder metalization, copper (Cu), silver, tin, aluminum, gold, and an organic solderability preservative (OSP).

17. A apparatus comprising:

a generally planar patch substrate having a first side and a second side;

a plurality of external connection pads on the second side of the patch substrate;

a plurality of electrical connections coupled to the external connection pads and extending through the patch substrate to the first side;

a plurality of plated contacts on the electrical connections and extending beyond the first side;

wherein a contact surface area of the plated contacts is smaller than a contact surface area of the external connection pads;

an electrically insulating adhesive attaching the patch substrate to a surface of a first electronic device; and a plurality of tin-copper interconnection interfaces electronically connecting the plated contacts to a plurality of contacts of the first electronic device.

18. The apparatus of claim 17, further comprising a plurality of solder balls or bumps attaching and electronically connecting the external connection pads to a plurality of contacts of a second electronic device.

19. The apparatus of claim 18, wherein the first electronic device comprises a printed circuit board (PCB) and the second electronic device comprises a packaging substrate.

20. The apparatus of claim 19, wherein the printed circuit board (PCB) includes one of a motherboard, a video card, a post processor, a processor, a video processor, a memory board, a memory chip, a digital signal processor, a power transformer connection, and a device on/off power switch connection; and the packaging substrate includes one of an electronic active device, a silicon electronic component, an active silicon device, an integrated circuit, chip, a memory, a processor, digital signal processor, a post processor, a video processor, and a memory chip.

21. The apparatus of claim 19, wherein the PCB includes at least four rows of a plurality of contact pads and a surface of the PCB includes electrically conductive traces to a plurality of contact pads of at least three of the four rows.

22. The apparatus of claim 18, wherein the first electronic device comprises a packaging substrate and the second electronic device comprises a printed circuit board (PCB).

23. The apparatus of claim 22, wherein packaging substrate comprises a flexible substrate having at least eight rows of a plurality of contact pads and a layer of the packaging substrate includes electrically conductive traces to a plurality of contact pads of at least eight of the eight rows.

* * * * *

UNITED STATES PATENT AND TRADEMARK OFFICE
CERTIFICATE OF CORRECTION

PATENT NO. : 7,097,462 B2 Page 1 of 1
APPLICATION NO. : 10/881243
DATED : August 29, 2006
INVENTOR(S) : Ichikawa It is certified that error appears in the above-identified patent and that said Letters Patent is hereby corrected as shown below:

Title page, item (75), inventor: at line 1 of the Inventor, after "Tsukuba" insert -- -shi--.

Signed and Sealed this

Thirtieth Day of October, 2007

JON W. DUDAS
*Director of the United States Patent and Trademark Office*